US006647766B2

(12) United States Patent
Despont et al.

(10) Patent No.: US 6,647,766 B2
(45) Date of Patent: Nov. 18, 2003

(54) DEVICE FOR CONTACTING AND/OR MODIFYING A SURFACE HAVING A CANTILEVER AND A METHOD FOR PRODUCTION OF SAID CANTILEVER

(75) Inventors: Michel Despont, Adliswil (CH); Ute Drechsler, Kilchberg (CH); Mark I. Lutwyche, Adliswil (CH); Hugo E. Rothuizen, Zurich (CH); Peter Vettiger, Langnau am Albis (CH)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 09/745,273

(22) Filed: Dec. 20, 2000

(65) Prior Publication Data

US 2001/0038598 A1 Nov. 8, 2001

(30) Foreign Application Priority Data

Dec. 31, 1999 (EP) .............................. 99126244

(51) Int. Cl.[7] .......................... H01L 21/00; G01B 5/28
(52) U.S. Cl. ............................. 73/105; 216/2; 216/11; 369/127; 369/170
(58) Field of Search ............................ 73/105; 216/2, 216/11, 99; 369/127, 135, 170, 173

(56) References Cited

U.S. PATENT DOCUMENTS 5,189,906 A  3/1993 Elings et al.

5,831,181 A  11/1998 Majumdar et al.

FOREIGN PATENT DOCUMENTS

EP       0848248 A1   6/1998   .......... G01N/27/00

OTHER PUBLICATIONS

H. J. Mamin et al., 'High Density Data Storage using Proximal Probe Techniques' IBM J. Res. Develop. vol. 39, No. 6, pp 681–700.
E. Grochowski and R. F. 'Future Trends in Hard Disk Drives', IEEE Trans. Magnetics vol. 32, No. 3, pp. 1850–1854, 1996.
R. P. Reid et al., '6MHz 2N/m Piezoresistive Atomic Force Microscope Cantilevers With Incisive Tips', J. Microelectronech. Syst. vol. 6, No. 4, pp. 294–303, 1997.
P. Vettiger et al., 'Ultrahigh Density, High Data Rate Micromechanical Scanning Probe Storage System', Proc. Intl. Conf. On Micro and NanoEngineering 98, LeuvenBelgium, pp. 11–17, to be published in Microelectronic Engineering.

*Primary Examiner*—Daniel S. Larkin
(74) *Attorney, Agent, or Firm*—Lewis Nunnelley; William D. Gill

(57) ABSTRACT

A device for contacting and/or modifying a surface having a cantilever connected to an almost plane carrier element staying apart from said surface, said cantilever having a tip at its loose end being in close contact to said surface. It is proposed that the cantilever stand out of the plane of said carrier element. Further, a method for producing the cantilever having a tip at its loose end. The device is suitable for thermomechanical writing and thermal readout of binary information, lithographic and imaging techniques, and for surface modification.

7 Claims, 4 Drawing Sheets

DEVICE FOR CONTACTING AND/OR MODIFYING A SURFACE HAVING A CANTILEVER AND A METHOD FOR PRODUCTION OF SAID CANTILEVER

TECHNICAL FIELD

The present invention relates to a device for contacting and/or modifying a surface having a cantilever connected to an almost plane carrier element staying apart from said surface, said cantilever having a tip at its loose end being in close contact to said surface. The device is useable for thermomechanical writing and thermal readout of binary information in a storage media, like a thin polymer film, or suitable for lithographic and imaging techniques, as well as for surface modification. The present invention also relates to a method for production of said cantilever with said tip.

BACKGROUND OF THE INVENTION

Devices for ultrahigh-density, high-speed data storage applications using thermomechanical writing and thermal readout in thin polymer film as storage media work on bases of atomic force microscopy (AFM) technique and are described in the following publications representing the state of the art:

- H. J. Mamin et al., "High density data storage using proximal probe techniques", IRM J. Res. Develop., Vol. 39, No. 6, pp. 681700, 1995,
- E. Grochowski and R. F. Hoyt, "Future Trends in Hard Disk Drives", IEEE Trans. Magnetics Vol. 32, No. 3, pp. 18501854, 1996
- R. P. Ried et al., "6 MHz 2N/m Piezoresistive Atomic-ForceMicroscope Cantilevers with Incisive Tips", J. Microelectromech. Syst., Vol. 6, No. 4, pp. 294302, 1997,
- U.S. Pat. No. 5,835,477 entitled MassStorage and
- P. Vettiger et al., "Ultrahigh Density, High data rate Micromechanical Scanning Probe Storage System", Proc. Intl. Conf. on Micro and NanoEngineering 98, LeuvenBelgium, September 1998, to be published in Microelectronic Engineering.

A basic arrangement for thermomechanical writing and readout is shown in FIGS. 1a–1c, representing prior art. Very close to the surface of a storage media 1, consisting of a polymer film, a tip 2 is positioned directing towards the surface of the storage media 1. The tip 2 protrudes from the loose end of a cantilever 3 which is fixed to a plane shaped carrier element 4 which is positioned in a defined distance from the surface of the storage media. For writing binary information into the storage media 1, the polymer surface is locally softened or melted with the heated tip 2 by simultaneously applying a light pressure onto the tip 2 by the cantilever 3, resulting in nanometer-scale indentations in the surface of the storage media 1 representing the binary information in the form of indents.

Heating of the tip 2 is provided by a resistive platform underneath the tip. For reading the binary information stored in the storage media 1, the heated platform and the heated tip are also used as a sensing element to detect topographical changes on the surface of the polymer film. While reading, a low constant electrical power is applied to heater platform so that the temperature of the platform is modulated by the distance between the platform and the storage media. The temperature change is measured through the resistivity of the platform and depends on the heat sinking capability of the heater platform environment. By scanning bit indentations, as shown in FIG. 1b, the distance between the platform and the surface of the storage media can change by some 10 nm, resulting in a platform temperature change due to cooling of the storage media. In FIG. 1b, the tip of the cantilever dips into the indentation causing more cooling of the cantilever system than that shown in FIG. 1c where the cantilever has a greater distance towards the surface of storage media.

For designing the cantilever with a tip at its loose end, some important aspects have to be considered. The mass of the cantilever has to be as small as possible to obtain soft, high-resonant frequency cantilevers. Soft levers are required for low loading force in order to eliminate or reduce tip and media wear, whereas a high resonant frequency allows high speed scanning. Also, the tip height should be as short as possible, as heater platform sensitivity depends strongly on the platform-media distance, as described relating to FIG. 1. However this requirement contradicts the demand of a large gap between the surface of the carrier element and the storage media to guarantee that only the tips are making contact with the media and not with the carrier element.

The object of the present invention is to realize a device especially for thermomechanical writing and thermal readout of binary information in a storage media, taking the above mentioned demands into account. Especially, the object of the present invention is to provide a tip arrangement which allows an array configuration of a multitude of single cantilevers and to guarantee as well that each single tip of said cantilevers stays in close contact to the surface of the storage media without wearing the surface of the storage media. Of course devices comprising the same basic assembly, i.e. having a cantilever connected to an almost plane carrier element staying apart from a surface, said cantilever having a tip at its loose end being in close contact to said surface, but usable for different applications like lithography, surface modification and/or imaging, just to name a few, shall also be improved in the same way and with the same inventive steps as in the case of the before mentioned device.

It is a further object of the present invention to improve the tip geometry and the method of production the cantilever and tip at the loose end of the cantilever, using methods which are easy to handle allowing a low-cost fabrication and high yields. The tip volume shall be as small as possible so that the tip mass can be reduced for realizing a high-resonant frequency cantilever system and reduce the heating time constant.

SUMMARY OF THE INVENTION

The object of the present invention is achieved by a device and a method as set forth in the appended claims.

The present invention relates to the shape of the cantilever which is normally straight and lying in the same plane as the carrier element. The normal and known way to be in certain contact to the surface is to make the tip longer. Because of all combined disadvantages, it is disclosed here to bend the cantilever out of the plane of the carrier element typically for a few micrometers.

The bending of the cantilever can be achieved by bending the cantilever along its whole direction. Bending occurs by providing an intrinsic or built in stress in the cantilever which is usually independent of the temperature environment of the cantilever. Intrinsic stress in the cantilever can be reached by a special heat treatment of the cantilever or by implantation of additional material like doping material into the cantilever or by stress building up during the cantilever material deposition.

Another method to bend the cantilever is to have a second material layer on top or under the cantilever which builds stress at the interface during the cantilever/stressing material stack fabrication which will perform the bending when the lever is released.

Bending of the cantilever can also be achieved by attaching additional material onto the cantilever by using an additional material having a thermal expansion coefficient $c_1$ which is different than the thermal expansion coefficient $c_2$ of the material of which the cantilever is made. Due to the different thermal expansion coefficients of both materials, the additional material causes a defined stress moment acting directly onto the cantilever being bent out of the plane of the cantilever element.

Normally the cantilever is made entirely of silicon for good thermal and mechanical stability which is connected with said carrier element commonly produce of silicon also, so that the cantilever and the carrier element are made out of one piece. By using plasma enhanced chemical vapor deposition (PECVD) a silicon nitrite layer is deposited at the base section of the cantilever which fixes the cantilever to the carrier element. The silicon nitrite layer also extends into areas of the cantilever not being supported by the carrier element, so that a controlled stress moment can be induced into the cantilever for bending out of the plane of the carrier element.

One advantage of the present invention is to provide a secure contact between the tip of the cantilever and the surface of the storage media and provide at the same time a clear space between the plane carrier element and the storage media. Furthermore, by applying a defined layer of silicon nitrite onto the cantilever, the bending of the cantilever is well controlled so that a distinct loading force acts onto the storage media without causing any damage. Also the tip height must not be very huge for contacting the surface of the storage media so that the tip can be down sized with the advantage to be easier to fabricated and with a tighter tolerance and to reduce its mass so that ultrahigh frequency motions of the cantilever can be realized.

In addition to the techniques for producing tips at the loose end of a cantilever by applying additional tip material to the cantilever, it is proposed that the tip be formed out of the same material as that of the cantilever. Using a special mask and applying wet etching, the structure of the tip can be formed out of the same material as that of the cantilever.

Due to the fact that the tip can be kept very small, it does not protrude much from the surface of the cantilever which is an advantage during lever manufacture since the tip can be more easily protected.

Another way of producing a tiny tip is to oxidize edges of the cantilever which sharpens the edges of the lever after removing the layer. The tip lying in the plane of the cantilever is therefore called "in-plane tip".

Combining the before described in-plane tip and the idea of bending the cantilever, the tip and the cantilever-making processes can be merged so that process steps can be reduced and yield can be increased. By this method, very controlled tip apex height can be achieved which is crucial for making one dimensional or two dimensional array of the cantilever. Tight tip apex height tolerance is necessary in an array to have a homogenous contact with the tips across the array.

DESCRIPTION OF THE DRAWINGS

The invention is described in detail below with reference to the following schematic drawings. It is to be noted that the figures are not drawn to scale.

DESCRIPTION OF PREFERRED EMBODIMENTS

Figure 1:
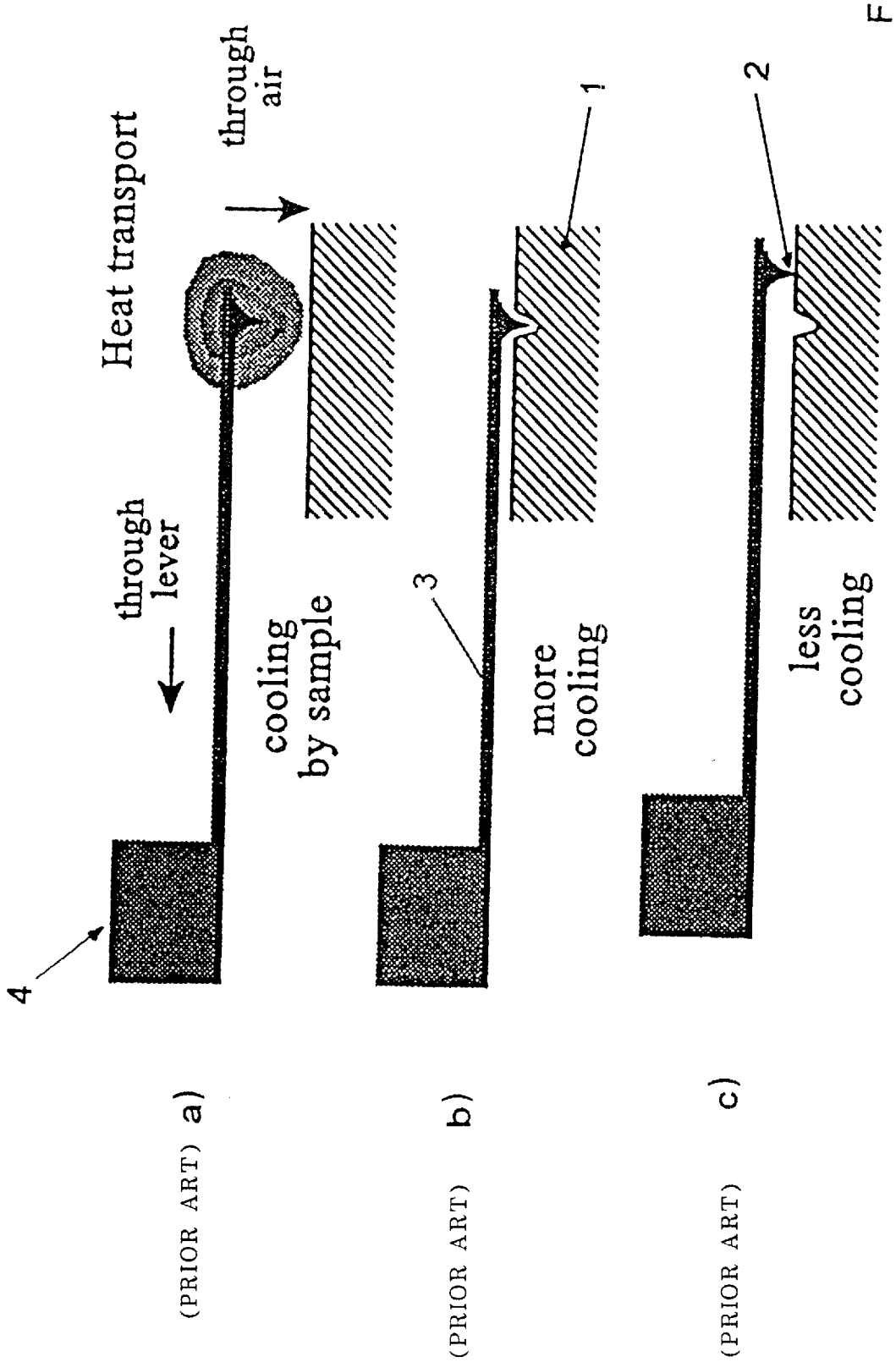
FIGS. 1a–1c schematic sketches describing a cantilever with a tip at its loose end (prior art), FIGS. 2a, 2b top- and side-view of a cantilever arrangement in a pre-bend situation, FIGS. 3a–3c cantilever arrangements in side-view, and FIGS. 4a–4d steps of fabrication of an in-plane tip.

FIGS. 1a–1c were described in the above abstract and show schematic sketches explaining the thermomechanical writing and thermal reading process.

Figure 2:
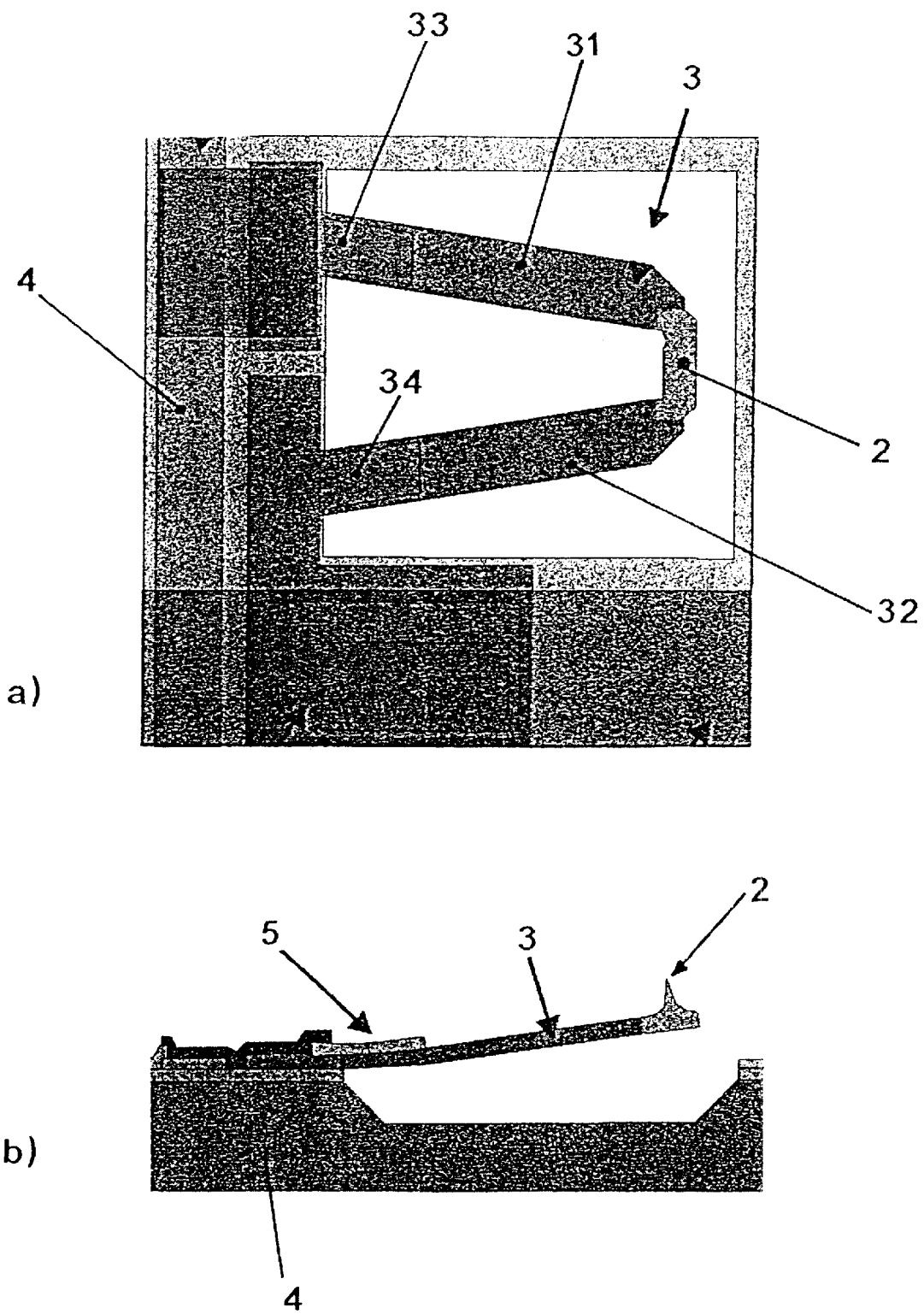

FIG. 2a shows the top view of a cantilever 3 which provides two separate lever arms 31, 32 connected at its base sections 33, 34 with the carrier element 4 having a flat plane shape (see also FIG. 2b showing a cross-section view). The carrier element 4 and also the cantilever 3 can be arranged multiple in a two-dimensional array which provides a two-dimensional cantilever array chip. At the loose end of the lever arms 31, 32, a heater platform 35 with a tip 2 on top is provided. The cantilever 3 is made preferably entirely of silicon for good thermal and mechanical stability. The two arms 31 and 32 of the cantilever 3 act as a mechanical spring and also for electrical connection to the heater platform where the tip 2 is provided.

In the side-view of FIG. 2b, the cantilever 3 stands out of the plane of the carrier element 4 due to an additional layer 5 of stress controlled nitrite which bends the cantilever upwards. The stress between the additional layer 5 and the cantilever is built at the cantilever-film interface and bends the cantilever.

The cantilever 3, shown in FIGS. 2a and 2b, can be arranged in a two-dimensional array consisting of a multitude of the before described cantilevers. Applying the inventive pre-bending stress of each single cantilever in a two-dimensional cantilever array chip, a uniform contact between each single tip and the storage media can be realized.

Figure 3:
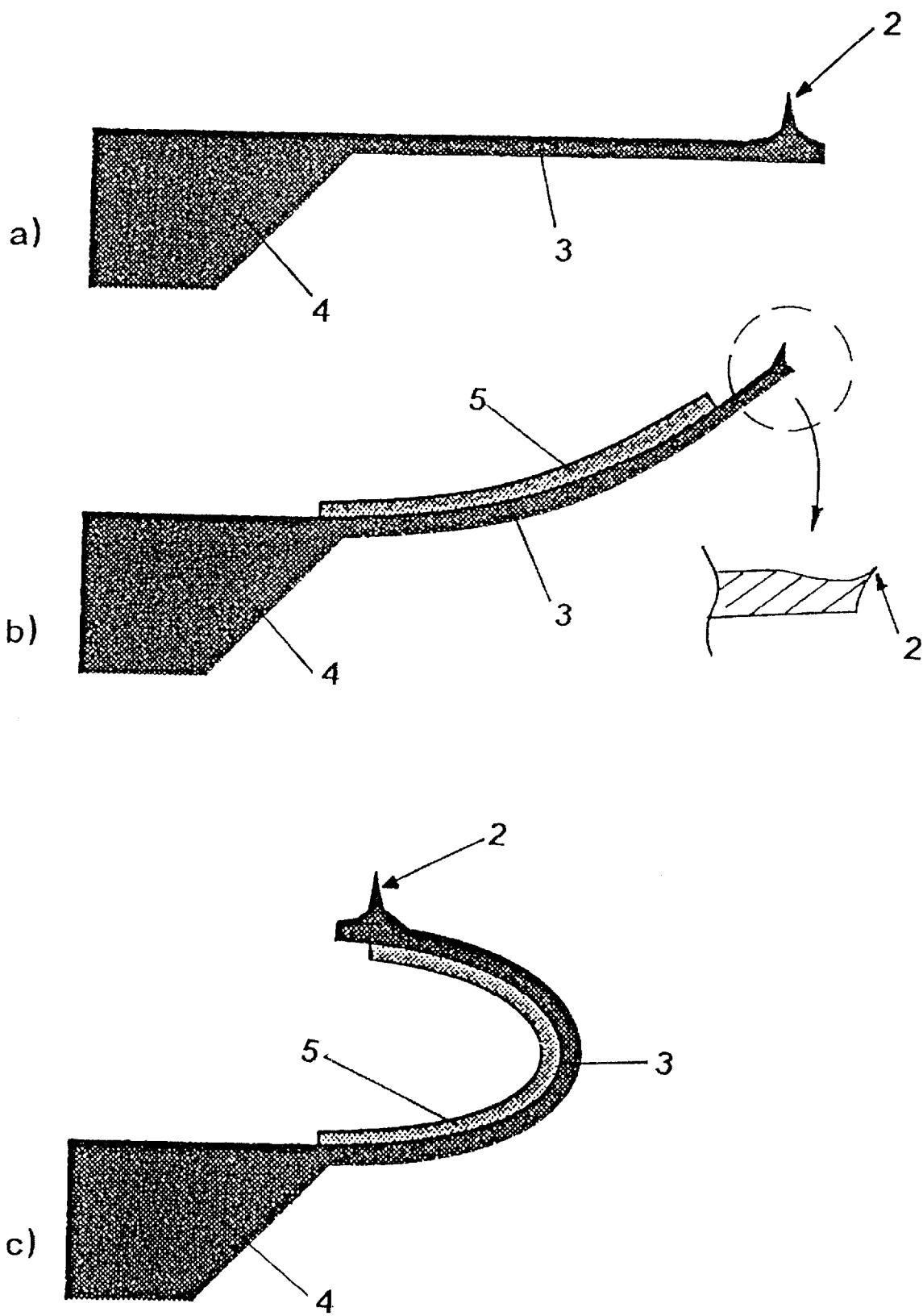

FIG. 3a shows a conventional cantilever arrangement consisting of carrier element 4, a cantilever 3 and a tip 2. The cantilever 3 is directed straight without bending in a preferred direction. Additional material is attached onto the upper surface of the cantilever 3, as shown in FIG. 3b, the additional layer 5 consisting of a material inducing, during its deposition, a tensile stress into the cantilever 3 for bending the cantilever 3 in a preferred direction such as it is the case in FIG. 3b in the upward direction. In deference to the embodiment of FIG. 3a in which the tip protrudes perpendicular over the surface of the cantilever, the tip of the embodiment of FIG. 3b does not protrude beyond the surface of the cantilever 3 at all, but arises over the surface of the carrier element 3 due to the bending stress caused by the layer of additional material 5. The so called "in-plane tip" can be manufactured within one and the same process step in which the cantilever itself is manufactured. The tip at the end of the cantilever is formed with wet etching and thermal oxidation providing a special tip structure at the cantilever.

Another way of bending the cantilever and arranging the tip 2 onto the cantilever's surface is shown in FIG. 3c. Here the cantilever is bent about 180° along its normal direction so that the tip which is at its backside still arise in an upwards direction.

Using different kinds of additional materials 5 having compressive or tensile thermal expansion coefficients comparing to the thermal expansion coefficient of the cantilever's material, the form of the cantilever can take on different kind of curves.

Figure 4:
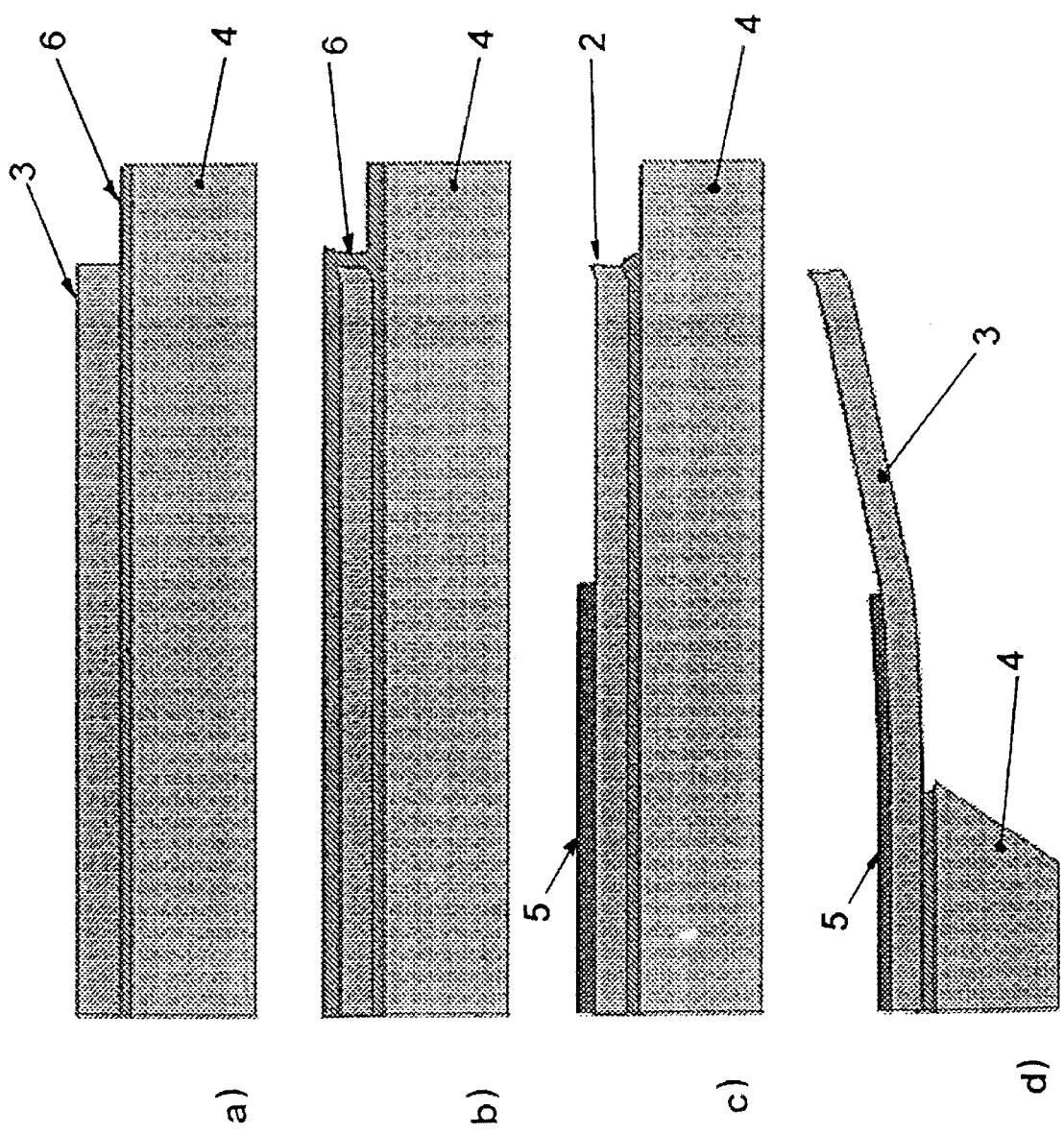

FIG. 4 represents several steps of producing a cantilever in detail. FIG. 4a shows a cross section of a carrier element 4 which is made of silicon onto its surface a protection layer 6 like SiO2 is attached. The protection layer 6 protects the carrier element from being etched while producing the cantilever layer 3 typically using wet etching.

FIG. 4b shows a way of forming an in-plane tip. For sharpening the edge of the cantilever layer 3, the surface of the cantilever 3 is oxidized by attaching an additional layer of oxide, for example SiO2. After removing the additional oxide layer 6 the edge is sharp enough for providing an in-plane tip 2.

FIG. 4c shows the step after depositing a stress layer 5 onto the cantilever 3 at its base section.

FIG. 4d shows the effect of the stress layer 5 onto the cantilever 3, which is released by removing parts of the carrier element under the loose end of the cantilever 3. The loose end of the cantilever 3 bends out of the plane of the carrier element 4.

The underlying idea of the invention for improving a device for thermomechanical writing and thermal readout of binary information in a storage media, like a thin polymer film, is based on bending the cantilever out of the plane of the carrier element, so that the distance between the surface of the storage media and the carrier element is sufficiently great to prevent the carrier element from contacting the surface, although the tip gets in close contact to the surface of the storage media. Fundamentally this idea is applicable to a multitude of other techniques which have the same situation of positioning nanometer or micrometer scaled objects, like tips or other scanning probes (e.g. scanning tunneling microscopy, near field optic microscopy), in close contact to a surface and at the same time the carrier elements of the objects have to be in sure distance to said surface.

For example, for imaging systems, lithography systems, or surface modification systems, the inventive bending of the cantilever with special scanning probes at its loose end leads to the same advantages as described before in connection with the device for thermomechanical writing and thermal readout of binary information in a storage media.

We claim:

1. A method for producing a cantilever connected to a carrier element having a generally planar shape, said carrier element having a surface which defines a plane of said carrier element, said cantilever having a tip at its loose end being in close contact to said surface, comprising:
   bending said cantilever by inducing a controlled stress such that said cantilever stands out of the plane of said carrier element, wherein said bending is realized by inducing a controlled stress in the cantilever by a method selected from a group consisting of treating thermally said cantilever, stress control of the cantilever material deposition, and implantation of additional material in said cantilever.

2. A method for producing a cantilever connected to a carrier element having a generally planar shape, said carrier element having a surface which defines a plane of said carrier element, said cantilever having a tip at its loose end being in close contact to said surface, comprising:
   bending said cantilever by inducing a controlled stress such that said cantilever stands out of the plane of said carrier element, wherein manufacturing of said cantilever and forming of said tip takes place in the same process steps; and
   wherein said process steps comprise oxidation sharpening of a box-like silicon structure.

3. An apparatus for positioning a tip in close proximity to a surface, comprising:
   a cantilever having a fixed end, a loose end, and a tip attached to said loose end; and
   a carrier element having a generally planar shape, said carrier element having a surface which defines a plane of said carrier element, said carrier element being attached to said fixed end of said cantilever, said cantilever is bent out of the plane of said carrier element to position said tip of said cantilever proximate to the surface;
   wherein the cantilever is made of a material having an intrinsic stress which induces the cantilever to bend out of said plane; and
   wherein said intrinsic stress is provided by a thermal treatment of said cantilever.

4. An apparatus for positioning a tip in close proximity to a surface, comprising:
   a cantilever having a fixed end, a loose end, and a tip attached to said loose end; and
   a carrier element having a generally planar shape, said carrier element having a surface which defines a plane of said carrier element, said carrier element being attached to said fixed end of said cantilever, said cantilever is bent out of the plane of said carrier element to position said tip of said cantilever proximate to the surface;
   wherein the cantilever is made of a material having an intrinsic stress which induces the cantilever to bend out of said plane; and
   wherein said intrinsic stress is provided by implantation in the cantilever.

5. An apparatus for positioning a tip in close proximity to a surface, comprising:
   a cantilever having a fixed end, a loose end, and a tip attached to said loose end; and
   a carrier element having a generally planar shape, said carrier element having a surface which defines a plane of said carrier element, said carrier element being attached to said fixed end of said cantilever, said cantilever is bent out of the plane of said carrier element to position said tip of said cantilever proximate to the surface; and
   wherein said tip is provided on a side of said cantilever being turned away from a surface to be placed in close proximity and said cantilever being bent along its direction approximately 180° so that said tip can then be positioned over a surface.

6. A method for producing a cantilever, comprising the steps of:
   connecting a cantilever having a fixed end, a loose end, and a tip connected to said loose end to a carrier element which has a surface defining a plane of said carrier element; and
   bending said cantilever such that said cantilever is bent out of the plane of said carrier element; and
   wherein said bending is realized by inducing a controlled stress in the cantilever by including at least one of the following steps:
   thermally treating said cantilever;
   a stress control of the cantilever material deposition; and
   implantation of additional material in said cantilever.

7. The method according to claim 6, wherein said tip is formed out of the same material as that of the cantilever.

* * * * *